(12) United States Patent
Un et al.

(10) Patent No.: US 9,093,951 B2
(45) Date of Patent: Jul. 28, 2015

(54) POLY-PHASE LOCAL OSCILLATOR

(71) Applicant: University of Macau, Macau (CN)

(72) Inventors: Ka-Fai Un, Macau (CN); Pui-In Mak, Macau (CN); Rui Paulo da Silva Martins, Macau (CN)

(73) Assignee: UNIVERSITY OF MACAU, Macau (CN)

( * ) Notice: Subject to any disclaimer, the term of this patent is extended or adjusted under 35 U.S.C. 154(b) by 0 days.

(21) Appl. No.: 14/073,060

(22) Filed: Nov. 6, 2013

(65) Prior Publication Data
US 2015/0123738 A1    May 7, 2015

(51) Int. Cl.
| | |
|---|---|
| H03B 27/00 | (2006.01) |
| H03B 5/12 | (2006.01) |
| H03L 7/18 | (2006.01) |
| H03L 7/24 | (2006.01) |
| H03L 7/23 | (2006.01) |
| H03K 23/68 | (2006.01) |
| H03L 7/087 | (2006.01) |

(52) U.S. Cl.
CPC .............. *H03B 5/1228* (2013.01); *H03L 7/18* (2013.01); *H03L 7/23* (2013.01); *H03L 7/24* (2013.01); *H03K 23/68* (2013.01); *H03L 7/087* (2013.01)

(58) Field of Classification Search
CPC ............. H03L 7/24; H03L 7/087; H03L 7/18; H03B 5/1228; H03K 23/68
USPC .............. 331/46, 2, 57, 55, 45; 327/159, 295, 327/115; 455/260, 318
See application file for complete search history.

(56) References Cited

U.S. PATENT DOCUMENTS 8,446,302 B2 *   5/2013   Miyashita ..................... 341/111

OTHER PUBLICATIONS

Ka-Fai Un, Pui-In Mak, Rui Paulo Da Silva Martins, "A 53-to-75-mW, 59.3-dB HRR, TV-Band White-Space Transmitter Using a Low-Frequency Reference LO in 65-nm CMOS," in IEEE Journal of Solid-State Circuits, Jun. 6, 2013, pp. 1-12, vol. PP, Issue 99.

* cited by examiner

*Primary Examiner* — Arnold Kinkead
(74) *Attorney, Agent, or Firm* — Bacon & Thomas, PLLC

(57) ABSTRACT

One embodiment of the present invention features a poly-phase local oscillator generator combining frequency dividers and direct-injection-locked phase correctors. The poly-phase local oscillator generator comprises a plurality of phase correctors configured to relax frequency and tuning range of a reference local oscillator (LO), and a plurality of frequency dividers, coupled to the phase correctors, configured to offer different frequency segments. The phase correctors are expandable, so that phase accuracy can be optimized by cascading more of themselves.

8 Claims, 18 Drawing Sheets

| | P-90° | P-45° | P0° | P45° | P90° | |
|---|---|---|---|---|---|---|
| | 2/5 | 3(1+α)/5 | 2/5 | | | ) ×4 |
| | | 2/5 | 3(1+α)/5 | 2/5 | | ) ×5.6(1+β) |
| | | | 2/5 | 3(1+α)/5 | 2/5 | ) ×4 |
| | 1̶/̶6̶ cancelled | 4.64+2.4α+2.24β | 6.56+3.36(α+β+αβ) | 4.64+2.4α+2.24β | 1̶/̶6̶ cancelled | |

FIG.5(b)

| | P-45° | P-22.5° | P0° | P22.5° | P45° | P67.5° | P90° | P112.5° | P135° | |
|---|---|---|---|---|---|---|---|---|---|---|
| | 1/5 | 1/2 | 5/8 | 3(1+α)/5 | 5/8 | 1/2 | 1/5 | | | ) ×4 |
| | | 1/5 | 1/2 | 5/8 | 3(1+α)/5 | 5/8 | 1/2 | 1/5 | | ) ×3(1+β) |
| | | | 1/5 | 1/2 | 5/8 | 3(1+α)/5 | 5/8 | 1/2 | 1/5 | ) ×4 |
| | α,β cancelled | 2.6+0.6β | 4.8+1.5β | 6.275+2.4α+1.875β | 6.8+1.8(α+β+αβ) | 6.275+2.4α+1.875β | 4.8+1.5β | 2.6+0.6β | α,β cancelled | |

FIG.6(b)

L-type ⊳○ S-type ▶○
A: for phase correction
B: for natural frequency suppression
C: for injection-locking

POLY-PHASE LOCAL OSCILLATOR

BACKGROUND OF THE INVENTION

1. Field of the Invention

The present generally relates to a poly-phase local oscillator, more particularly, to a poly-phase local oscillator generator combining frequency dividers and expandable phase correctors.

2. Description of the Related Art

Improvements of sharing the geographically unused white spaces in TV band (54 to 864 MHz) has led to the development of IEEE 802.22 wireless regional area network (WRAN) [1], which embodies the cognitive radio (CR) techniques to enable an opportunistic share of the spectrum [2]. To avoid causing detrimental interference to the incumbent primary users, one key challenge of such a TV-band transmitter (TX) lies on managing the unwanted harmonic emission [3] without pricey or complicated filtering modules [4].

Harmonic rejection mixers (HRMs), which are designed to reject local oscillator (LO) harmonics (or "images"), permits a saving on radio frequency (RF) band-filtering to be made, for example in software-defined radio (SDR). Usual implementations of HR mixers use a weighted combination of hard-switching mixers that need careful alignment of phase and gain parameters. Hard-switching mixer is one of the sources generating influential sidebands associated with the harmonics of the local oscillator (LO). Multi-path mixers feature the desired integratability and wideband ability in harmonic rejection [5]. A typical differential mixer already can stem all even harmonics, while rejecting the odd ones entails additional paths. The 6-path harmonic-reject mixer (6P-HRM) [6] can suppress the critical $3^{rd}$ and $5^{th}$ harmonics by around 35 dB under typical 1% gain and 1° phase errors, but it is still not the whole for a TX covering a 16×-wide RF range, i.e., harmonics up to the $15^{th}$ are in-band. An active tunable-LC filter [7] can be employed to extend both harmonic rejection ratio (HRR) (42 dB) and the number of rejecting harmonics (up to $15^{th}$), but the power (171 mW) is penalized to uphold the linearity, while calibration should be adopted to surmount the LC-tank variation. Although the 18-path HRM (18P-HRM) is capable to reject harmonics up to the $15^{th}$ (40 dB HRR) and suppress certain distortion sidebands, the enforced baseband (BB) input (18 paths, 18 phases) and LO format (18 phases, 33% duty cycle) are complicated. The former implies 7 more differential digital-to-analog converters and 14 more I/O pins than the 6P-HRM. The latter resorted from a div-by-9 ring counter draws substantial power (156 mW) and entails a high-frequency reference LO ($LO_{ref}$=9×RF), adding complexity to the frequency synthesis.

In fact, the constraint of high $LO_{ref}$ is shared by most HRM-based architectures. For the receiver in [9], $LO_{ref}$=8× RF is entailed for precise 8-phase LO generation, limiting its operating bandwidth (BW) between 400 to 900 MHz (albeit a 5 GHz signal-path BW). Another example is [10], the rotational 16P-HRM entails $LO_{ref}$=16×RF, restricting its operating BW between 100 to 300 MHz while drawing considerable power (69.8 mW at 100 MHz).

In order to break the common constraint of high-frequency reference LO ($LO_{ref}$) in existing HRM-based architecture [7]-[10], this invention describes a number of techniques to realize a wideband TX with high HRR achieved on chip, measuring more favorable power (53 to 75 mW) and HRR (59.3 dB) than the prior art [7], [8].

SUMMARY OF THE INVENTION

According to the present invention there is provided a poly-phase local oscillator generator, comprising: a plurality of phase correctors configured to relax frequency and tuning range of a reference local oscillator (LO); and a plurality of frequency dividers, coupled to the phase correctors, configured to offer different frequency segments; wherein the plurality of phase correctors are expandable by cascading more of themselves for enhancing phase-correcting ability.

Further, the plurality of phase correctors are direct-injection-locked phase correctors. The plurality of frequency dividers are even-ratio-only frequency dividers.

The poly-phase local oscillator generator disclosed herein may be implemented in any means for achieving various aspects, and other features will be apparent from the accompanying drawings and from the detailed description that follow.

BRIEF DESCRIPTION OF THE DRAWINGS

The various embodiments of the present invention are illustrated by way of example, and not by way of limitation, in the figures of the accompanying drawings and in which:

FIG. 1 (c) shows system plan for the upper sub-band (432 to 864 MHz).

FIG. 2 (b) illustrates one example of single-ended diagram of single-stage 14P-HRM.

FIG. 3 (b) illustrates one example of single-ended diagram of two-stage 14P-HRM.

FIG. 5 (b) illustrates one example of two-stage approximated gain ratio of the $1^{st}$ harmonic.

FIG. 6 (b) illustrates one example of two-stage approximated gain ratio of the 1st harmonic.

FIG. 8 (b) illustrates one example of circuit diagram of lowpass filter in FIG. 8 (a)

FIG. 8 (c) illustrates one example of circuit diagram of mixer bank in FIG. 8 (a)

FIG. 8 (d) illustrates one example of circuit diagram of harmonic-rejection filter in FIG. 8 (a)

FIG. 9 (b) illustrates a diagram showing simulated magnitude responses of the driver amplifier with and without BSF and $R_dC_d$ degeneration.

FIG. 10 (b) shows 8-phase LO generation using cascaded DIL 8PC.

DESCRIPTION OF THE EMBODIMENTS

Various exemplary embodiments, features, and aspects of the invention will be described in detail below with reference to the drawings. The invention is to be understood that each specific element includes all technical equivalents that operate in a similar manner to accomplish a similar purpose. Various terms that are used in this specification are to be given their broadest reasonable interpretation when used in interpreting the claims.

Moreover, features and procedures whose implementations are well known to those skilled in the art are omitted for brevity. For example, design, selection, and implementation of basic electronic circuit elements such as bias elements, current mirror arrangements, logic elements, current and voltage sources, metal oxide semiconductor field effect transistors (MOSFETs), and the like, lie within the ability of those skilled in the art, and accordingly any detailed discussion thereof may be omitted.

Figure 1A:
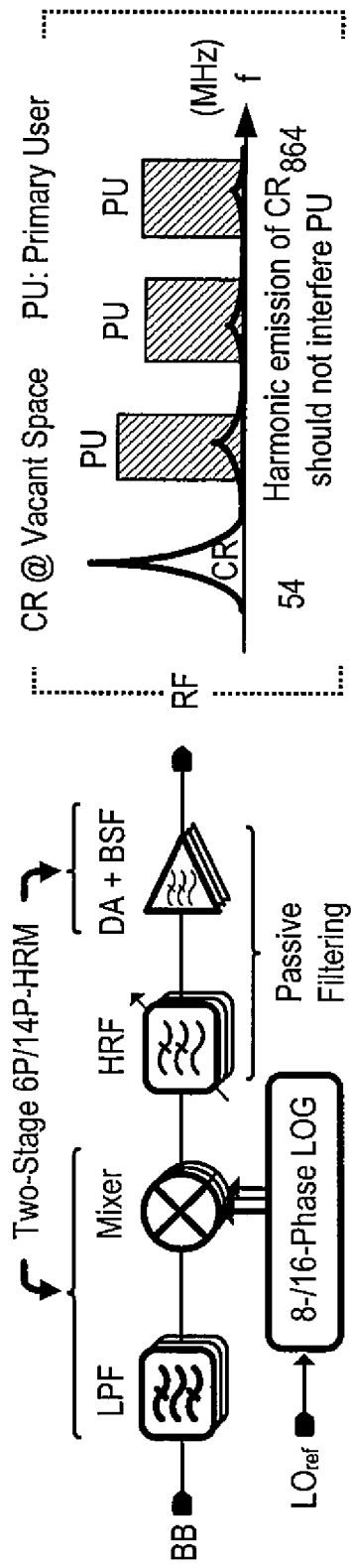
FIG. 1 (a) illustrates architecture of a proposed transmitter according to an embodiment of the present invention FIG. 1 (b) shows system plan for the lower sub-band (54 to 432 MHz)

Referring firstly to FIG. 1(a) there is shown schematically the proposed wideband direct-upconversion TX architecture aiming at a 60 dB HRR for all LO harmonics. The TV band is partitioned into lower (54 to 432 MHz) and upper (432 to 864 MHz) sub-bands.

Figure 1B:
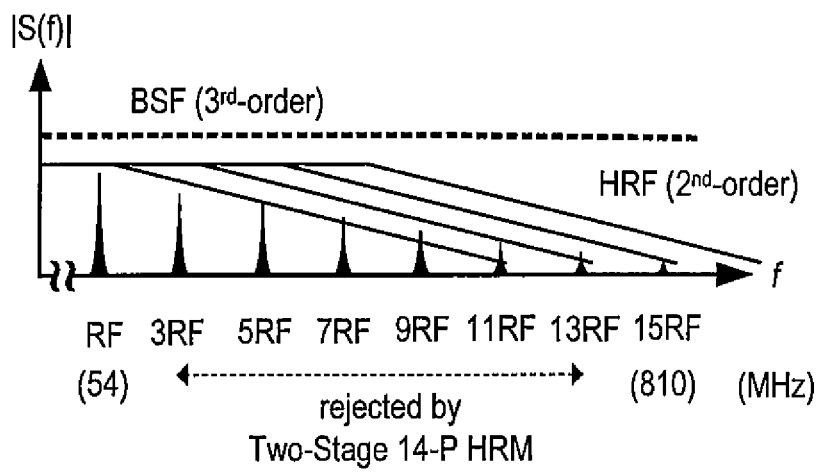
Figure 1B:
Figure 1B:
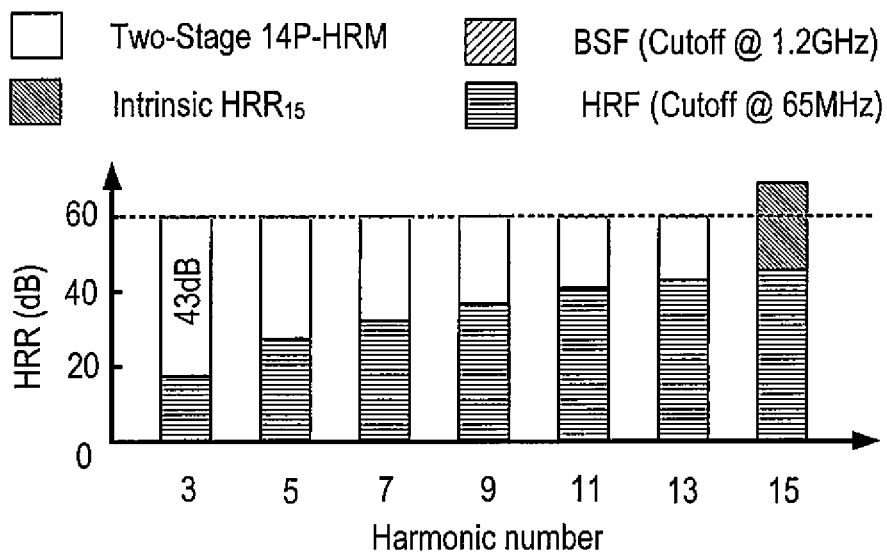

The lower sub-band is handled by a scheme: Two-Stage 14P-HRM+Passive Filtering. Unlike the single-stage HRMs [6]-[8], the two-stage HRM expanded from [9] is highly robust to the gain error by making it the product of stage errors (details in Sub-Section III-D). Comparing with the 18P-HRM, the 14P-HRM rejects one less harmonic (i.e., the $15^{th}$), but the requested BB inputs (4 paths, 4 phases) and LO format (16 phases, 50% duty cycle) are much simpler. As shown in FIG. 1(b), the worst HRR happens at the lowest RF of 54 MHz. The far-out $15^{th}$ harmonic at 810 MHz has an inherent attenuation of 23.5 dB, and can be easily furthered by filtering. Unlike the active LC-notch filter [7], here a simple $2^{nd}$-order passive-RC lowpass filter (LPF) is employed as the harmonic-rejection filter (HRF), having neither power nor linearity overhead. A few BW steps automatically selected with the LO bands are simple enough to enhance both in-band and out-band HRRs.

Figure 1C:
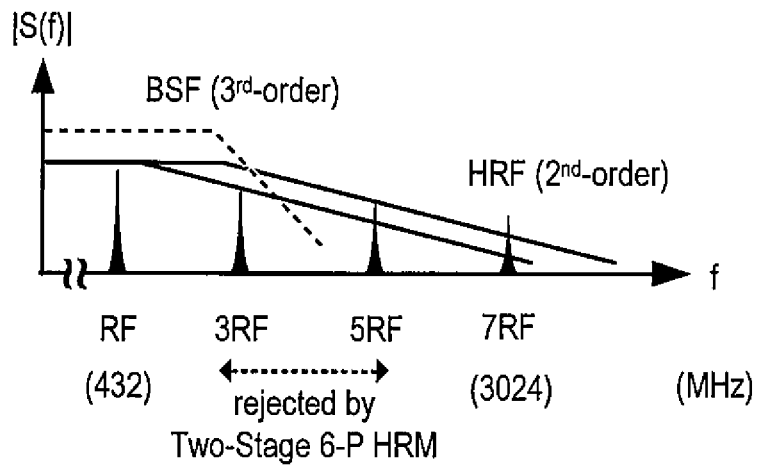
Figure 1C:
Figure 1C:
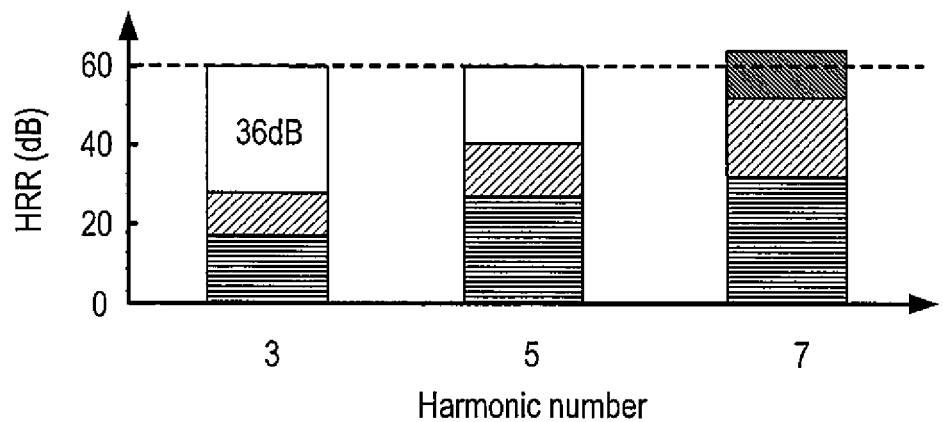

For the upper sub-band, it is handled by a scheme: Two-Stage 6P-HRM+Passive Filtering. As shown in FIG. 1(c), the worst HRR occurs at 432 MHz RF, locating the first uncancelled $7^{th}$ harmonic at around 3 GHz which is far from the TX BW, and will be well-suppressed by the HRF.

In order to band-limit the output noise spectrum and further the out-band HRR, the driver amplifier (DA) features another $3^{rd}$-order passive-CLC LPF to serve as a band-selection filter (BSF). Both the BSF and HRF are low Q and thereby immune to process variations.

Counting all filtering, and the intrinsic decay of LO-harmonic power, the HRR requested from the two-stage 6P-HRM (14P-HRM) is relaxed to 36 dB (43 dB) for the 60 dB HRR target. This relaxation implies lower LO-phase-error requirement from the 8-/16-phase LO generator (LOG), given that the gain error has been made insignificant to the HRR under the two-stage HRMs. The principles of single-/two-stage 6P-HRM and 14P-HRM are presented next.

Single-Stage 6P-HRM and 14P-HRM

Figure 2A:
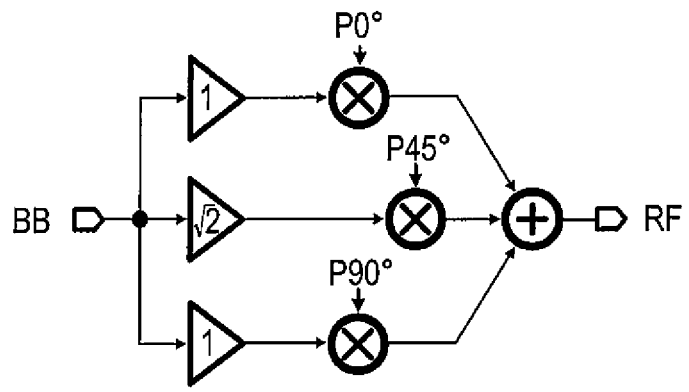
FIG. 2 (a) illustrates one example of single-ended diagram of single-stage 6P-HRM.
Figure 2B:
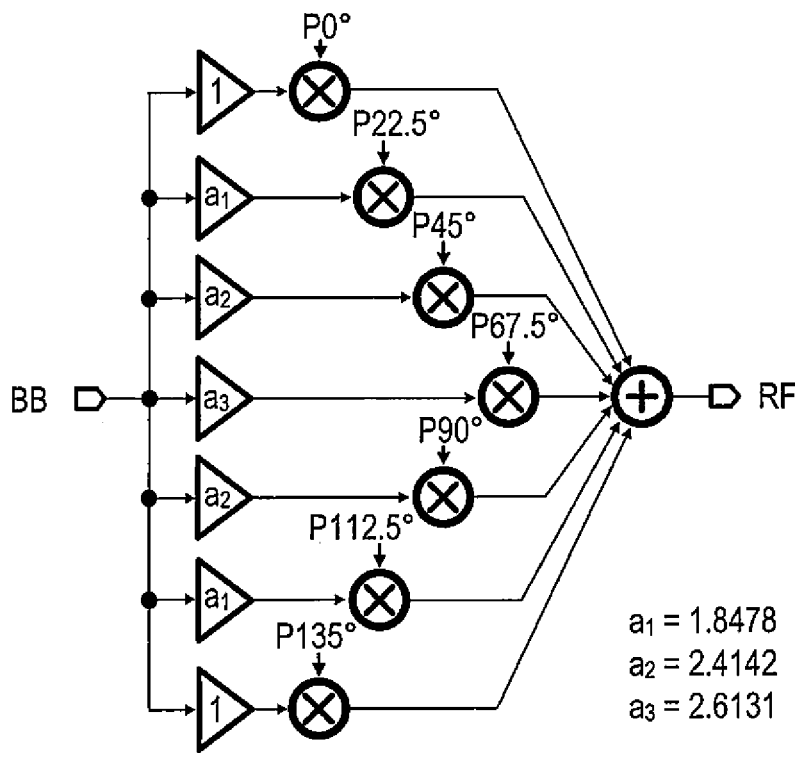

FIG. 2(a) depicts the single-ended diagram of single-stage 6P-HRM. It entails an 8-phase LOG for 45° phase shifting and a gain ratio $[\cos(\pi/4):1:\cos(\pi/4)]$ between paths. The limitation of 6P-HRM is that mainly the $3^{rd}$, $5^{th}$, $11^{th}$ and $13^{th}$ harmonics are rejected. Alternatively, the single-stage 14P-HRM [FIG. 2(b)] rejects harmonics up to the $13^{th}$. It entails a 16-phase LO for 22.5° phase shifting, and a gain ratio $[\cos(3\pi/8):\cos(\pi/4):\cos(\pi/8):1:\cos(\pi/8):\cos(\pi/4):\cos(3\pi/8)]$ between paths, which can be numerically approximated as [1:1.8478:2.4142:2.6131:2.4142:1.8478:1].

Two-Stage 6P-HRM and 14P-HRM for TX

Figure 3A:
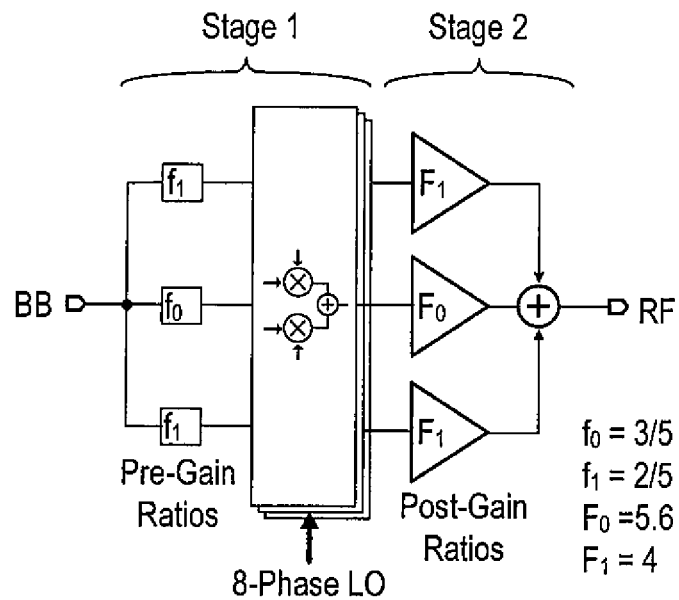
FIG. 3 (a) illustrates one example of single-ended diagram of two-stage 6P-HRM.
Figure 3B:
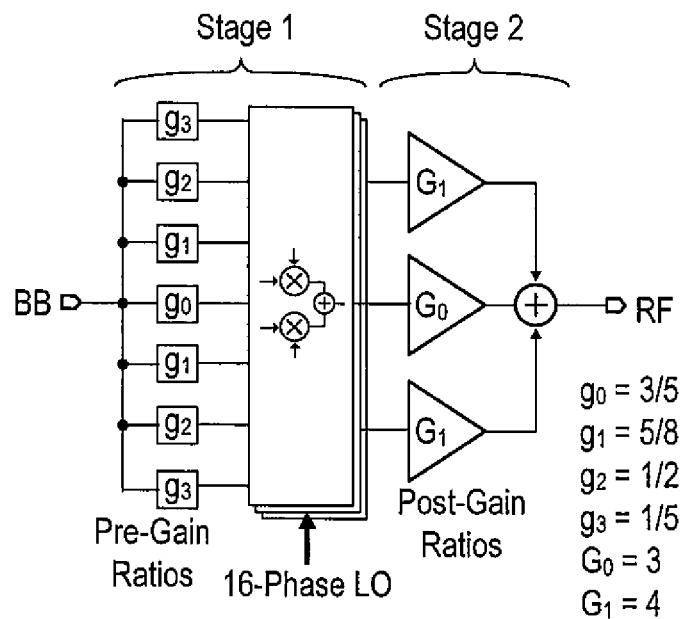
Figure 4:
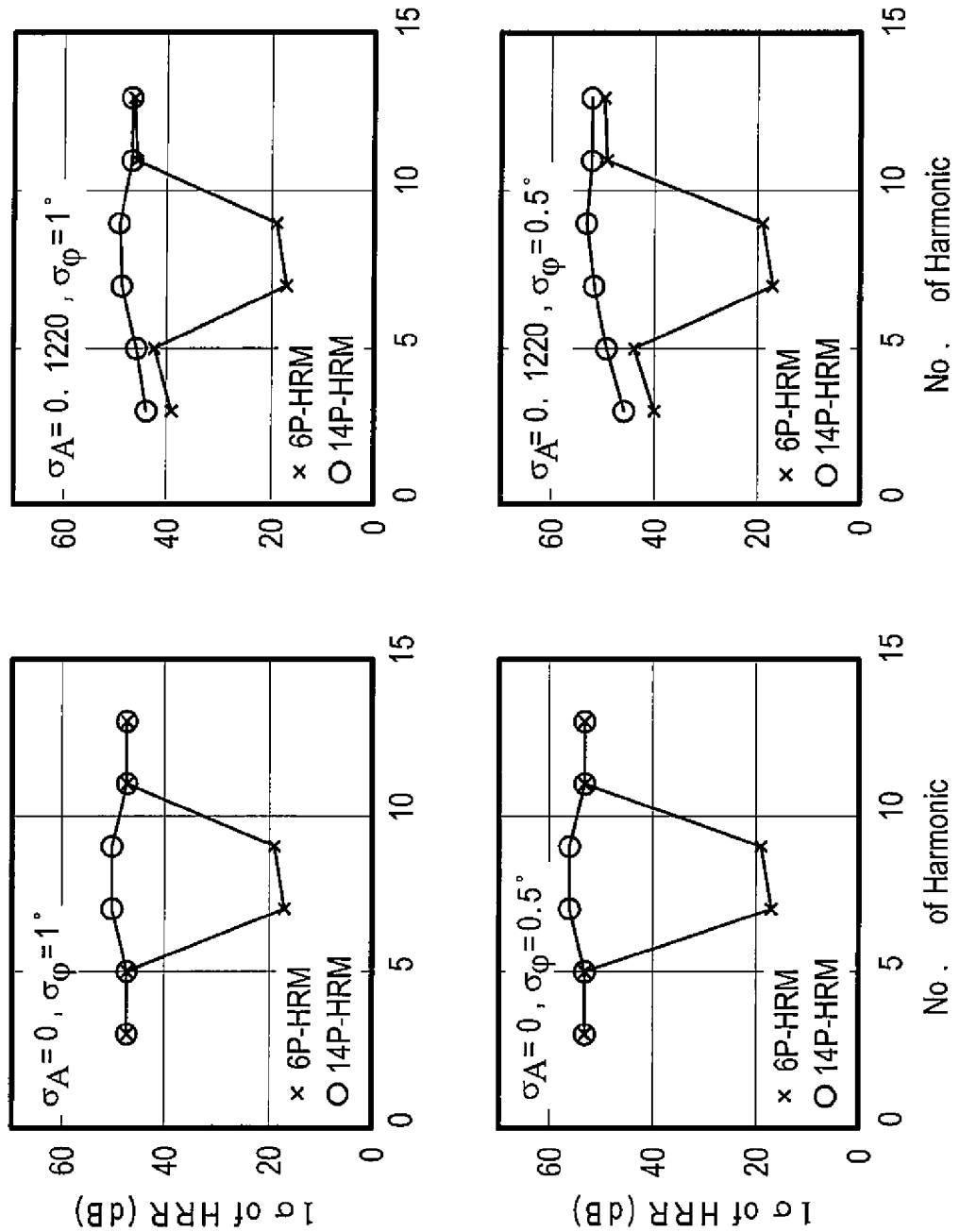
FIG. 4 shows harmonic rejection ratio (HRR) of 6P-HRM and 14P-HRM under four combinations of gain and phase mismatches.

Both two-stage 6P-HRM [FIG. 3(a)] and 14P-HRM [FIG. 3(b)] involve gain weighting at BB and RF, phase rotation and signal recombination. To resolve the gain mismatch, the selected gain ratios should be obtained via minimizing the cost function between the true and approximated values, while easing the circuit implementation.

For the two-stage 6P-HRM, the irrational gain ratio $[\cos(\pi/4):1:\cos(\pi/4)]$ is realized half at BB with a pre-gain ratio [2/5:3/5:2/5], and half at RF with a post-gain ratio [4:5.6:4]. The 45° phase rotation is embodied into the mixers driven by an 8-phase LO. After all, the resultant gain ratio is [29:41:29]. This approximation has <0.1% relative error when compared to their true values. To be described later, such pre-gain ratio befits circuit realization in the BB LPFs, whereas the post-gain ratio minimizes the switching elements between 6P-HRM and 14P-HRM.

Similarly, for the 14P-HRM, its irrational gain ratio $[\cos(3\pi/8):\cos(\pi/4):\cos(\pi/8):1:\cos(\pi/8):\cos(\pi/4):\cos(3\pi/8)]$ is realized half at BB with a pre-gain ratio [1/5:1/2:5/8:3/5:5/8:1/2:1/5] and half at RF with a post-gain ratio [4:3:4]. The mixers driven by a 16-phase LO realize the 22.5° phase rotation. The resultant gain ratio [1:1.8462:2.4134:2.6154:2.4134:1.8462:1] has <0.1% relative error when compared to their true values.

Gain and Phase Mismatches of 6P-HRM and 14P-HRM

The intrinsic HRR of 6P-HRM and 14P-HRM can be compared in terms of random gain and phase mismatches. The concerned HRR expressions are summarized in TABLE I. $\sigma_A$ and $\sigma_\phi$ are the standard deviations of the gain and phase mismatches, respectively. Note that the HRR has no difference between single-stage and two-stage HRMs. The only difference is on $\sigma_A$ [9]. Several HRR cases under different combinations of $\sigma_A$ and $\sigma_\phi$ are plotted in FIG. 3. The square-wave-like LO is based on a duty cycle (d) of 50% for generality. As expected, the 14P-HRM rejects significantly more the $7^{th}$ and $9^{th}$ harmonics, and is inherently more robust to gain mismatch. The next sub-section describes the effectiveness of two-stage 6P-HRM and 14P-HRM in gain mismatch reduction.

TABLE I

Inherent HRR of 6P-HRM and 14P-HRM.

| | 6P-HRM * | 14P-HRM * |
|---|---|---|
| $HRR_3$ | $-\dfrac{\sin^2(3\pi d)}{\sin^2(\pi d)}\left[\left(\dfrac{\sigma_A}{12}\right)^2 + \left(\dfrac{\sigma_\varphi}{4}\right)^2\right]$ | $-\dfrac{\sin^2(3\pi d)}{\sin^2(\pi d)}\left[\left(\dfrac{\sigma_A}{25.6}\right)^2 + \left(\dfrac{\sigma_\varphi}{4}\right)^2\right]$ |

TABLE I-continued

Inherent HRR of 6P-HRM and 14P-HRM.

| | 6P-HRM * | 14P-HRM * |
|---|---|---|
| $HRR_5$ | $-\frac{\sin^2(5\pi d)}{\sin^2(\pi d)}\left[\left(\frac{\sigma_A}{20}\right)^2 + \left(\frac{\sigma_\varphi}{4}\right)^2\right]$ | $-\frac{\sin^2(5\pi d)}{\sin^2(\pi d)}\left[\left(\frac{\sigma_A}{42.7}\right)^2 + \left(\frac{\sigma_\varphi}{4}\right)^2\right]$ |
| $HRR_7$ | $-\frac{1}{7}$ ^ | $-\frac{\sin^2(7\pi d)}{\sin^2(\pi d)}\left[\left(\frac{\sigma_A}{59.7}\right)^2 + \left(\frac{\sigma_\varphi}{4\sqrt{2}}\right)^2\right]$ |
| $HRR_9$ | $-\frac{1}{9}$ ^ | $-\frac{\sin^2(9\pi d)}{\sin^2(\pi d)}\left[\left(\frac{\sigma_A}{76.8}\right)^2 + \left(\frac{\sigma_\varphi}{4\sqrt{2}}\right)^2\right]$ |
| $HRR_{11}$ | $-\frac{\sin^2(11\pi d)}{\sin^2(\pi d)}\left[\left(\frac{\sigma_A}{44}\right)^2 + \left(\frac{\sigma_\varphi}{4}\right)^2\right]$ | $-\frac{\sin^2(11\pi d)}{\sin^2(\pi d)}\left[\left(\frac{\sigma_A}{93.9}\right)^2 + \left(\frac{\sigma_\varphi}{4}\right)^2\right]$ |
| $HRR_{13}$ | $-\frac{\sin^2(13\pi d)}{\sin^2(\pi d)}\left[\left(\frac{\sigma_A}{52}\right)^2 + \left(\frac{\sigma_\varphi}{4}\right)^2\right]$ | $-\frac{\sin^2(13\pi d)}{\sin^2(\pi d)}\left[\left(\frac{\sigma_A}{110.9}\right)^2 + \left(\frac{\sigma_\varphi}{4}\right)^2\right]$ |

^Inherent decay value of the LO harmonic power

Gain Mismatch Reduction by Two-Stage 6P-HRM and 14P-HRM

Figure 5A:
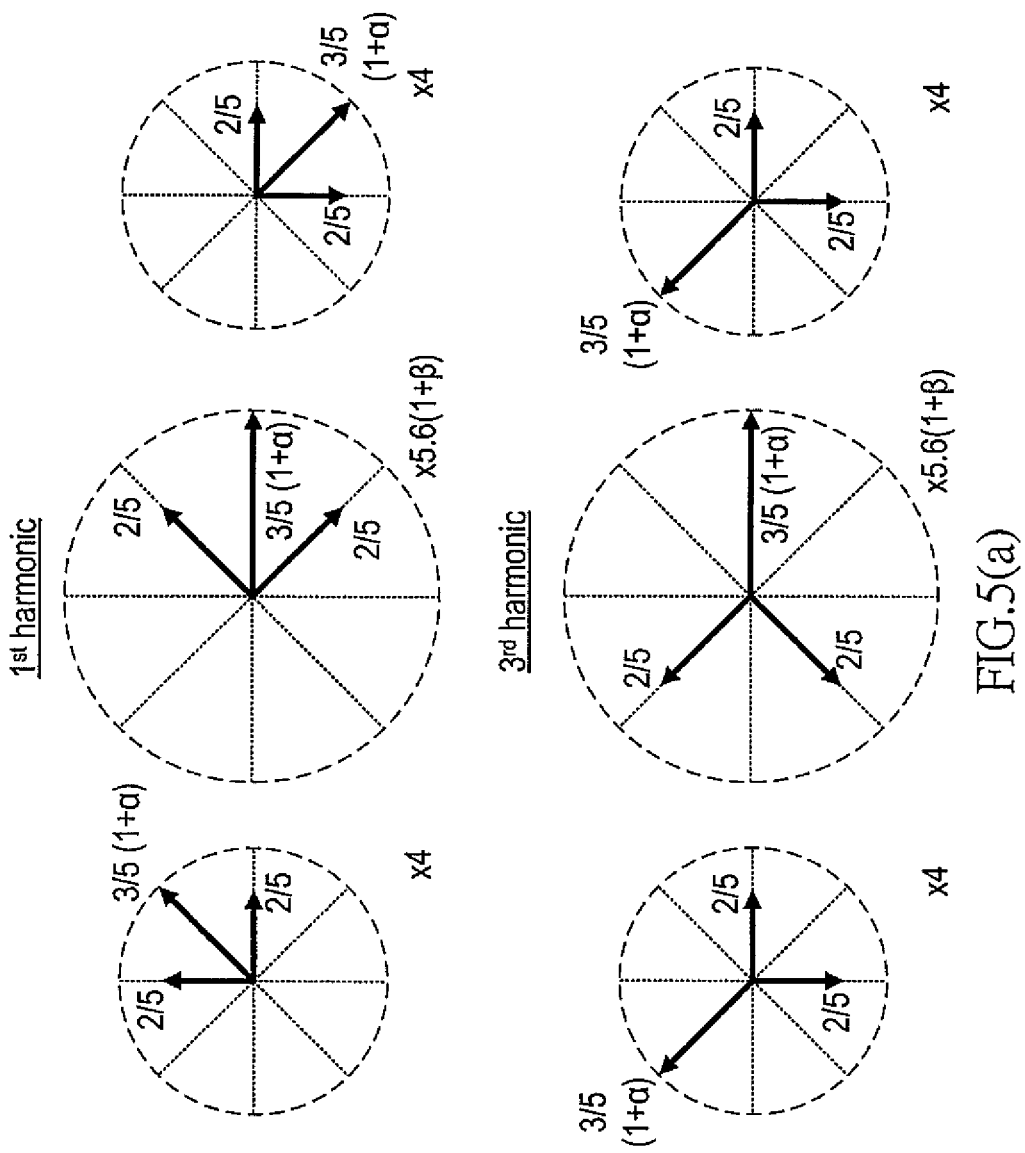
FIG. 5 (a) illustrates one example of vector diagram for gain mismatch illustration of the two-stage 6P-HRM.

The gain mismatch of two-stage 6P-HRM can be derived using a vector diagram in FIG. 5(a). The three vectors in every circle have 45° phase shifting for the $1^{st}$ harmonic. The vector magnitudes represent the gain ratio of the first stage, whereas the multiplying factors represent the gain ratios of the second stage. Also, the vectors of adjacent circles have 45° phase shift. The relative error of the first and second stages are denoted as α and β, respectively. Every corresponding vector of the $3^{rd}$ harmonic has the same amplitude, but shifted by 3 times in phase. The two-stage approximated gain ratio of the $1^{st}$ harmonic can be calculated as shown in FIG. 5(b). The total relative error of the $3^{rd}$ harmonic is given by (the subscript 2-s implies a two-stage HRM), $$\varepsilon_{2-s,6P-HRM} = \frac{41 - 29\sqrt{2} + (21 - 15\sqrt{2})\alpha + (21 - 14\sqrt{2})\beta + 21\alpha\beta}{41 + 29\sqrt{2} + (21 + 15\sqrt{2})\alpha + (21 + 14\sqrt{2})\beta + 21\alpha\beta}, \quad (1)$$

which can be approximated as $-1.49 \times 10^{-4} - 2.60 \times 10^{-3}\alpha - 1.46 \times 10^{-2}\beta + 0.256\alpha\beta$. This result is different from the derivation given in [9], since it uses 1:√2:1 as the gain ratio for both stages during the calculation, which does not match the practical circuit. In our model the exact gain ratios for both stages are adopted. In our derivation, the $1^{st}$ term results from the approximation of the √2 by 41/29 and the $2^{nd}$ term appears from the gain mismatch of the first stage; both are negligibly small. The $3^{rd}$ term is determined by the gain mismatch of the second stage and it is suppressed by 68.5 times. The $4^{th}$ term is even minor as it is the product of the first and second stage gain errors. Thus, the gain error after two-stage approximation becomes insignificant.

Figure 6A:
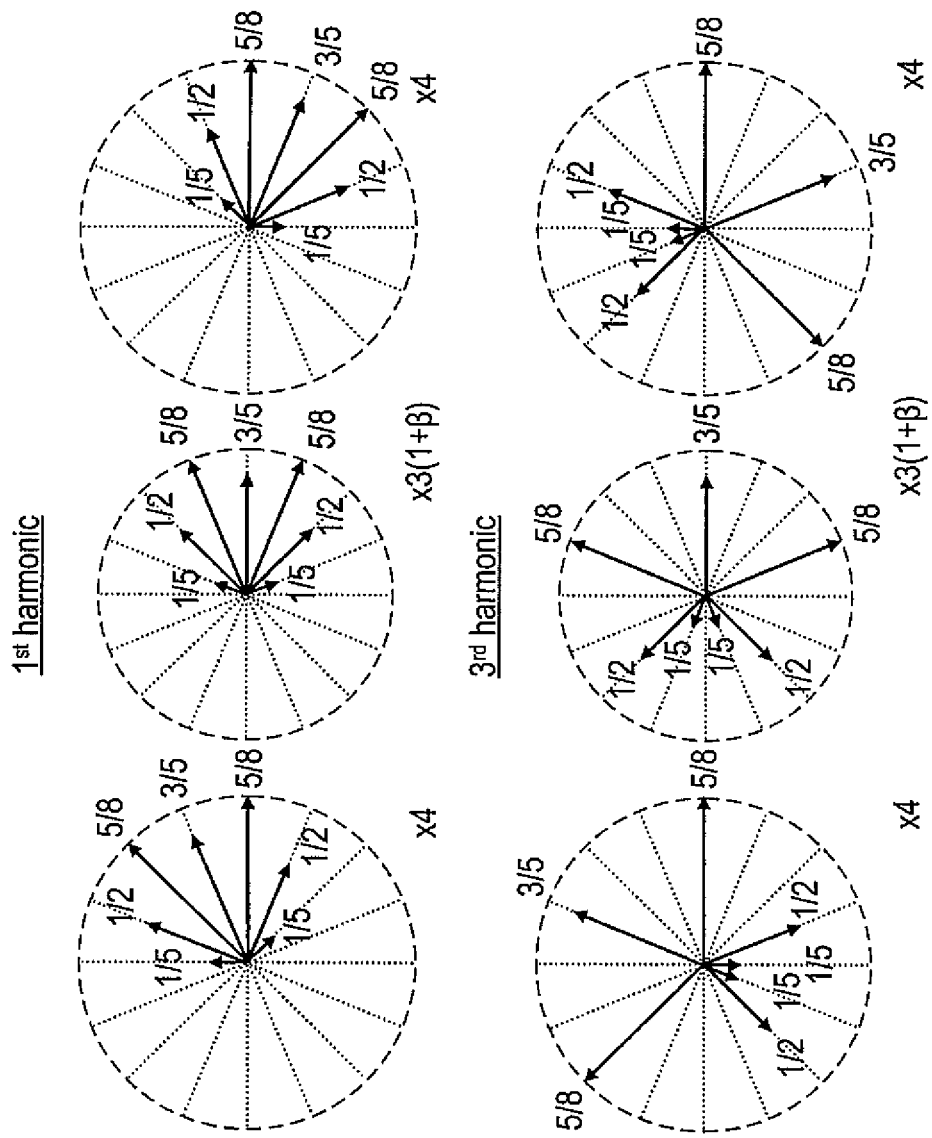
FIG. 6 (a) illustrates one example of vector diagram for gain mismatch illustration of the two-stage 14P-HRM.

A similar vector diagram for two-stage 14P-HRM can be drawn in FIG. 6(a). There are 7 vectors in every circle representing the 7 gain ratios for every single path. Every adjacent vector has 22.5° phase shifting. The two-stage approximated gain ratio of the 1st harmonic can be calculated as shown in FIG. 6(b). Under the same mismatch parameters as 6P-HRM, the total relative error of the 3rd harmonic can be evaluated to be, $$\varepsilon_{2-s,14P-HRM} = \frac{0.010 + 3.64\alpha + 5.08 \times 10^{-3}\beta + 1.8\alpha\beta}{27.17 + 6.23\alpha + 7.84\beta + 1.8\alpha\beta}, \quad (2)$$

which can be approximated as $3.78 \times 10^{-4} + 0.134\alpha + 1.87 \times 10^{-4}\beta + 6.62 \times 10^{-2}\alpha\beta$. It can be observed that the gain mismatch of the first stage is suppressed by 7.46 times while the gain mismatch of the second stage is almost cancelled.

Comparison with the Two-Stage HRM in Receiver [9]

Figure 7:
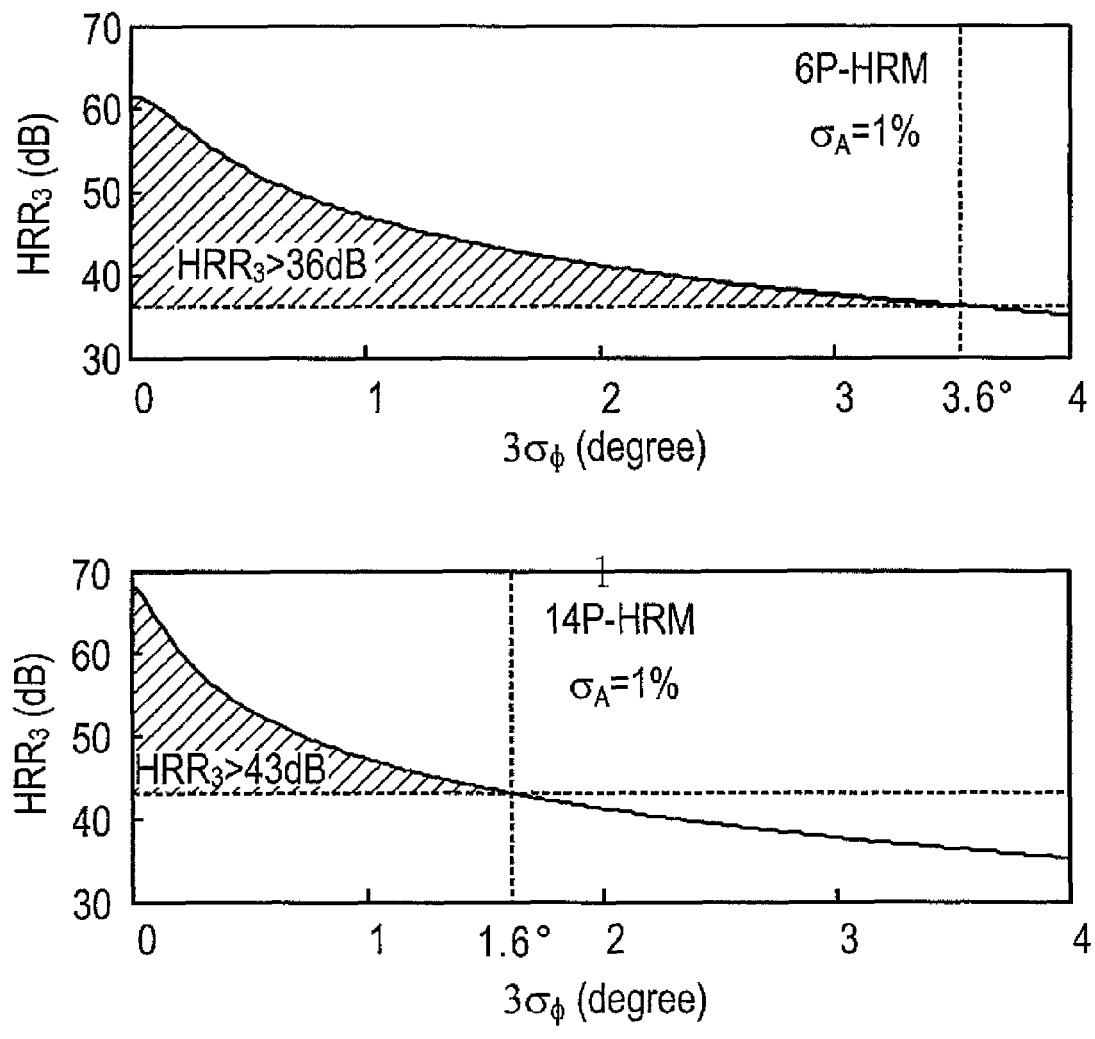
FIG. 7 shows theoretical $HRR_3$ of 6P-HRM (upper) and 14P-HRM (lower) versus $3\sigma_\phi$.

As analyzed above, with the two-stage 6P-HRM and 14P-HRM, the gain mismatch becomes manageable. Recalling from FIG. 1, for a targeted HRR of 60 dB, the 6P-HRM (14P-HRM) should contribute just 36 dB (43 dB). Thus, the acceptable $3\sigma_\varphi$ is relaxed to 3.6° (1.6°) for the 8-phase (16-phase) LO as plotted in FIG. 7, where $\sigma_A=1\%$. Both are much relaxed when compared with [9], which entails 0.03° LO phase error to bear the entire 60 dB HRR target. Thus, combining HRM with filtering in a TX should lead to significant power savings in the LO path. Moreover, as the HRR is mainly limited by the accuracy of the BB pre-gain ratios, the robustness of the two-stage HRM in TX should be better than that in receiver [9] (its pre-gain ratio is at RF).

Implementations

Figure 8A:
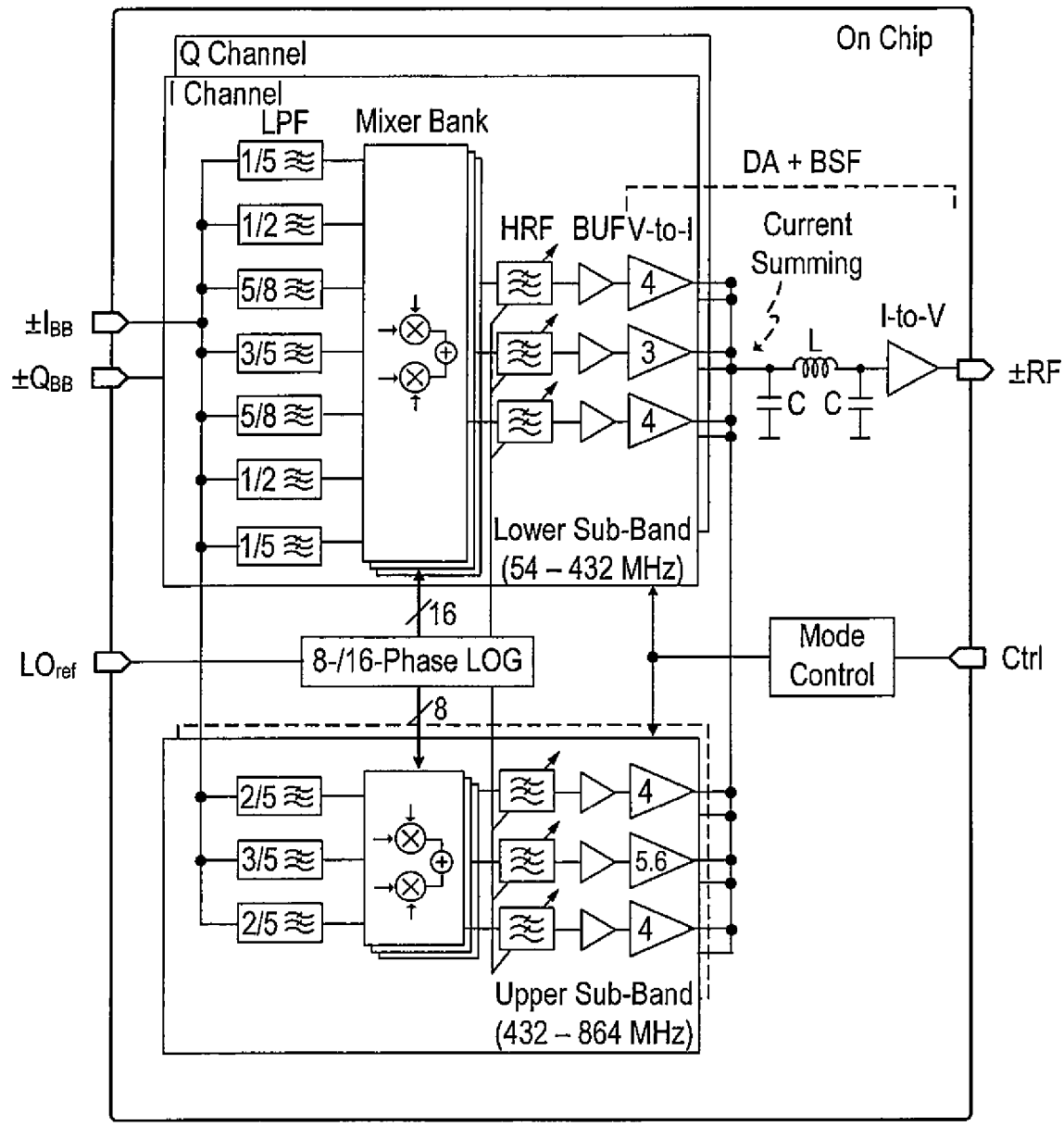
FIG. 8 (a) illustrates one embodiment of detailed schematic of the proposed transmitter.
Figure 8B:
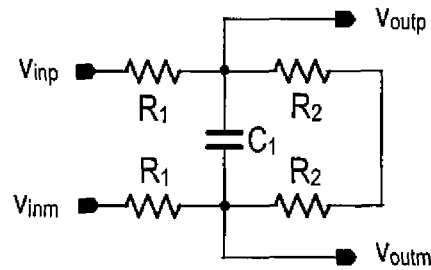

FIG. 8(a) depicts the detailed schematic of the proposed TX according to a preferred embodiment of the present invention. The implementation is fully differential even it is exhibited as single-ended for brevity. The outputs of the upper and lower sub-band paths are combined at the DA, which should driver an off-chip power amplifier. The key building blocks are described below.

Co-Design of BB LPF, Mixer Banks and RF HRF

FIG. 8 (b) is one example of circuit diagram of lowpass filter (LPF) in FIG. 8 (a). The first-stage gain ratio is embedded into the BB passive-RC LPF. Excellent matching over process variations is achieved via using a ratio of resistors: $R_2/(R_1+R_2)$. The −3-dB cutoff frequency $f_c$ is given by, $$f_c = \frac{1}{2\pi(R_1 \| R_2)C_1}, \quad (3)$$

Figure 8C:
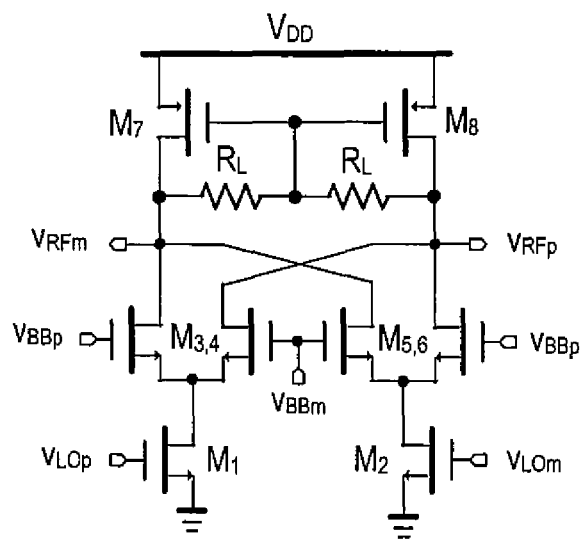
Figure 8D:
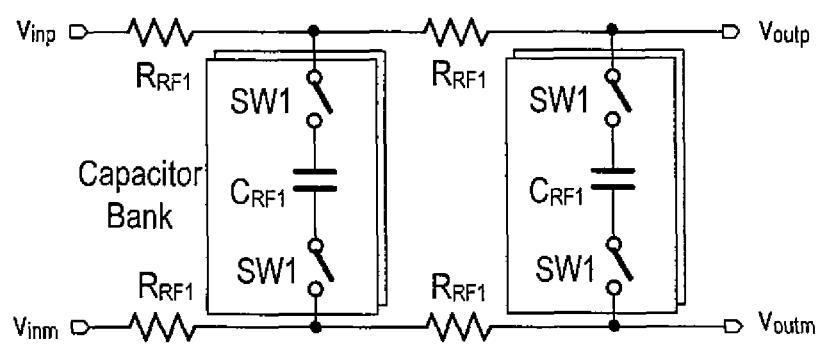

For every path of the LPF, $C_1$ and $R_1//R_2$ are chosen to be 2 pF and 7.96 kΩ, respectively, such that a fixed cutoff frequency of 10 MHz can be set, minimizing also the phase mismatch at the BB. FIG. 8(c) illustrates one example of circuit diagram of mixer bank in FIG. 8(a). The phase rotation and frequency upconversion are realized using a bank of active mixers, with each unit. FIG. 8(d) illustrates one example of circuit diagram of harmonic-rejection filter (HRF) in FIG. 8(a). Since the 14P-HRM only rejects harmonics up to the $13^{th}$, the RF HRF is designed to suppress the $15^{th}$ harmonic by 36.5 dB to meet the 60 dB HRR target. It is a $2^{nd}$-order passive-RC network featuring four (65, 124, 235 and 456 MHz) and two (460 and 900 MHz) optimized cutoffs automatically selected with the LO for the lower and upper sub-bands, respectively. The effect of process variations and mismatches on HRR is assessed by Monte-Carlo simulations. For instance, for a 65 MHz cutoff, the simulated standard deviation is 8.9 MHz. When transmitting a signal at 54 MHz (the toughest case), the corresponding $HRR_3$ (at 162 MHz) varies just ±1.3 dB, avoiding any calibration.

A Wideband DA with an Embedded CLC-Ladder BSF

Figure 9A:
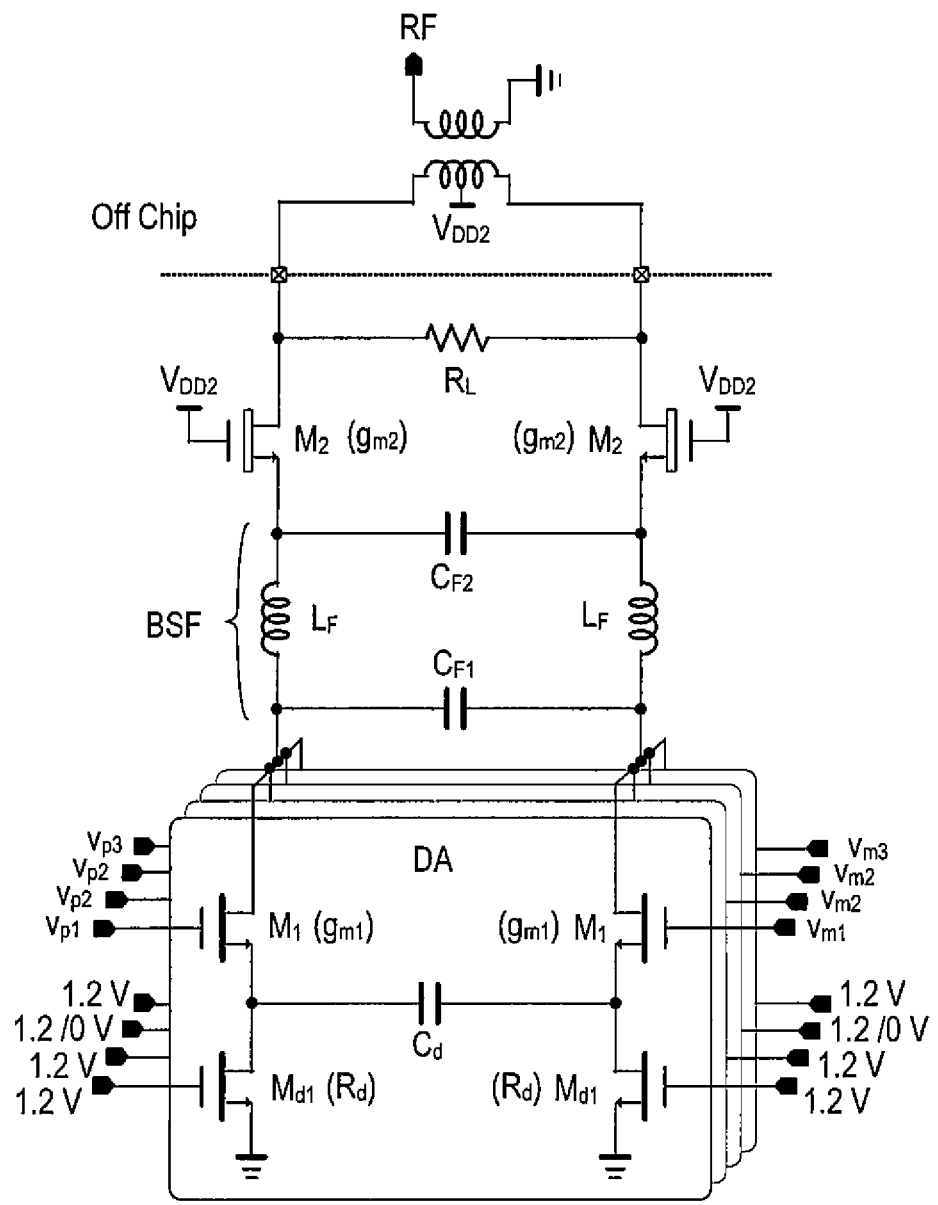
FIG. 9 (a) illustrates one embodiment of driver amplifier with embedded band-selection filter.

The schematic of the DA is depicted in FIG. 9(a). The segmented V-to-I input branches of the DA realize the required second-stage gain ratio. $M_1$ is source-degenerated by $R_dC_d$ to improve the passband flatness. The effective transconductance $g_{m,eff}$ is given by, $$g_{m,eff} = \frac{g_{m1}}{1+g_{m1}R_d} \frac{1+s2R_dC_d}{1+s\frac{2R_dC_d}{1+g_{m1}R_d}}, \quad (4)$$

where $g_{m1}$ is the transconductance of $M_1$, and $R_d$ is the on-resistance of $M_{d1}$ which also serves as a switch for changing the gain ratio at RF (4:5.6:4↔4:3:4), where only the mid branch has to be switchable. Although 5.6↔3 is not integer-ratio switching, gain mismatch at the second stage is indeed minor.

The DA uses a thick-oxide MOSFET as the cascade device to allow using a 2-V supply for better linearity. The combined output current is filtered in current mode by a 3rd-order passive-CLC BSF. The frequency response of the BSF is given by, $$H_{BSF}(s) = \frac{1/g_{m2}}{1+s2(C_{F1}+C_{F2})g_{m2}+s^2 2C_{F1}L_F+s^3 4C_{F1}C_{F2}L_F/g_{m2}}, \quad (5)$$

where $C_{F1}=C_{F2}=2.37$ pF and $L_F=4.5$ nH lead to a cutoff of 1.6 GHz. After accounting the parasitic and package effects, the cutoff of the DA stays at 1.2 GHz. From Monte-Carlo simulations, the 1.2 GHz cutoff can have a standard deviation of 71.4 MHz. When transmitting a signal at 432 MHz (the toughest case), the corresponding $HRR_3$ at 1.296 GHz varies just ±1.9 dB, which is acceptable without any calibration.

The overall frequency response of the DA can be derived as, $$H_{DA}(s) = \frac{v_{out}(s)}{v_1(s)} = \frac{g_{m1}Z_F g_{m2}R_L}{2(1+g_{m1}Z_d)(1+s2C_{F1}Z_F+s^2 2C_{F1}L_F)}, \quad (6)$$

where $g_{m2}$ is the transconductance of $M_2$, and $Z_d$ is the impedance of the RC degeneration as given by, $$Z_d = \frac{R_d}{1+s2R_dC_d}. \quad (7)$$

Figure 9B:
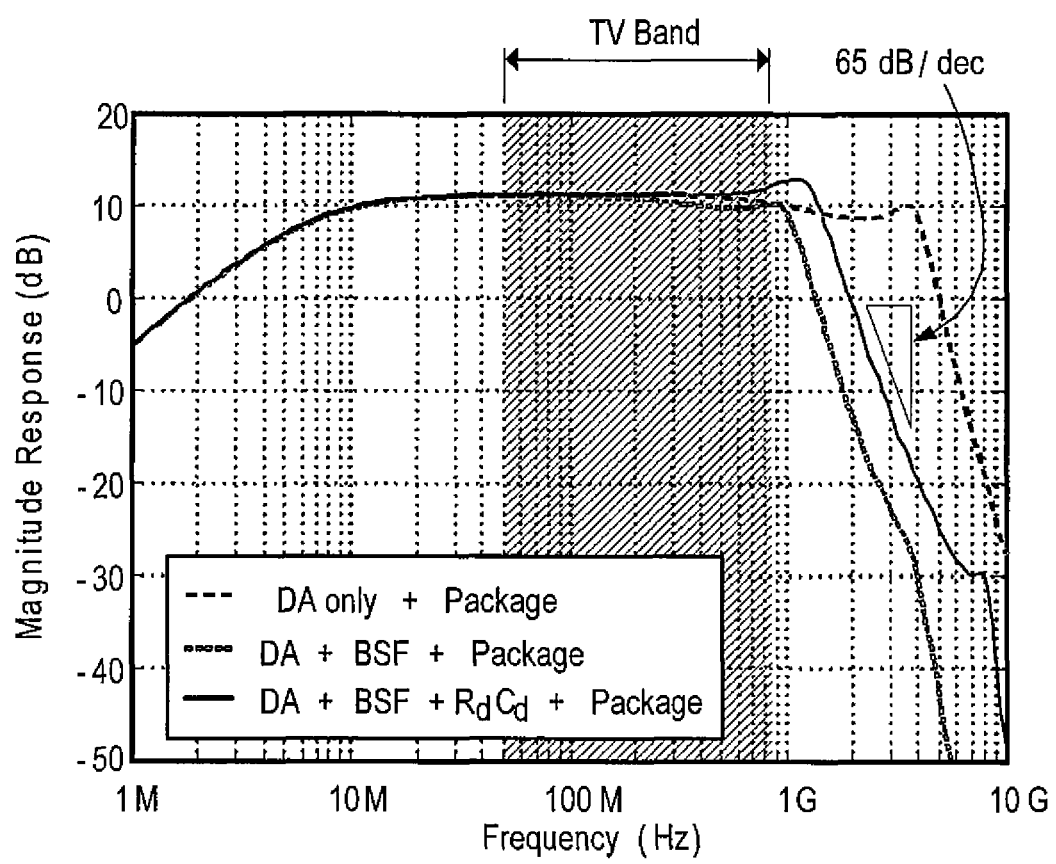

Together with the package model, the simulated frequency responses of the DA with and without the BSF and $R_dC_d$-degeneration are compared in FIG. 9(b). It is clear that without the BSF the BW of the DA is excessive (~4 GHz), while the optimized response has small gain droop and shows a strong stopband rejection of around 65 dB/dec.

Wideband Low-$LO_{ref}$ 8-/16-Phase LOG

Figure 10A:
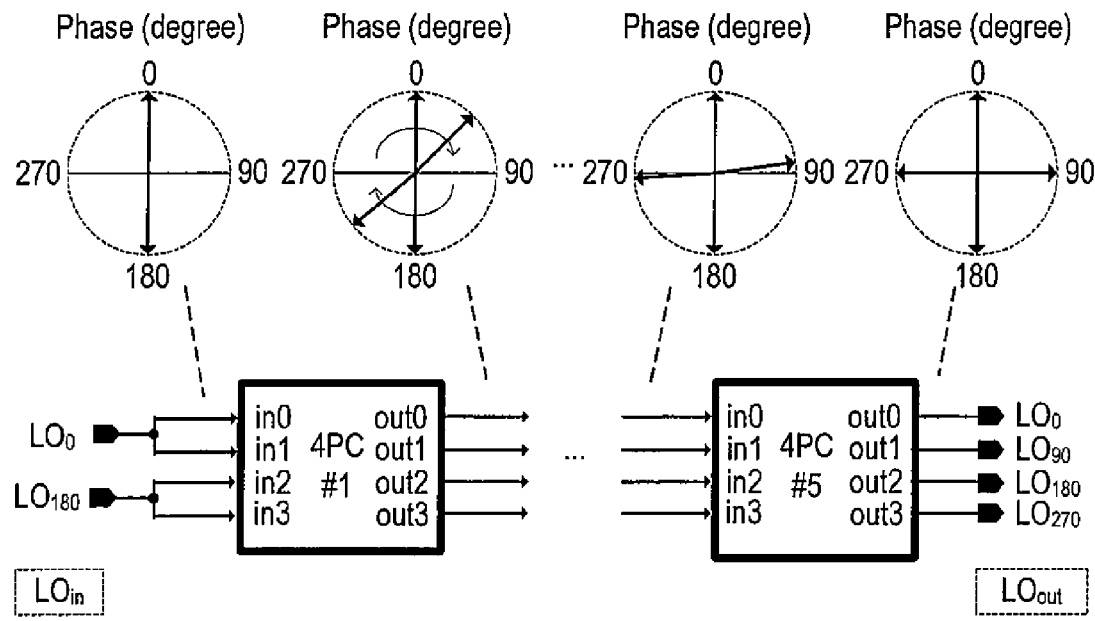
FIG. 10 (a) shows 4-phase LO generation using cascaded DIL 4PC.
Figure 10A:
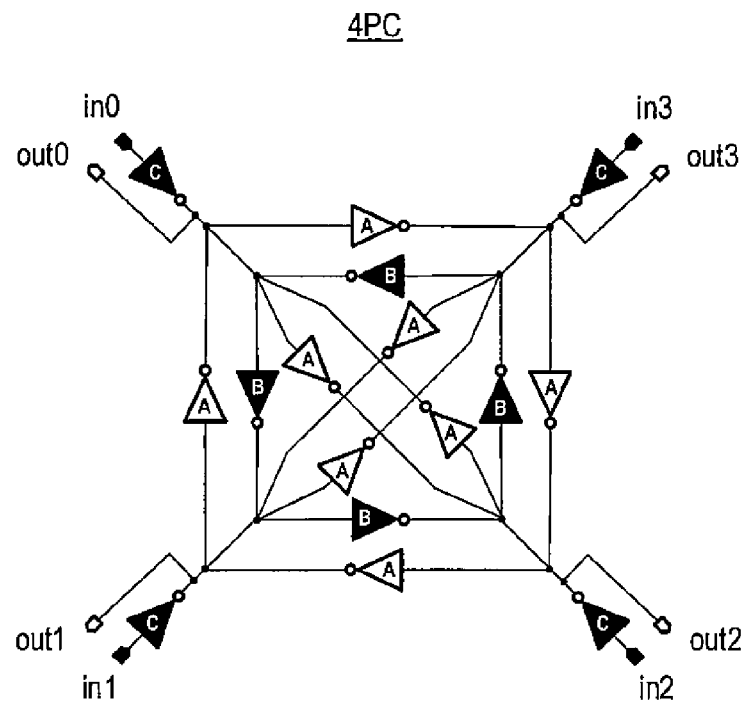
Figure 10B:
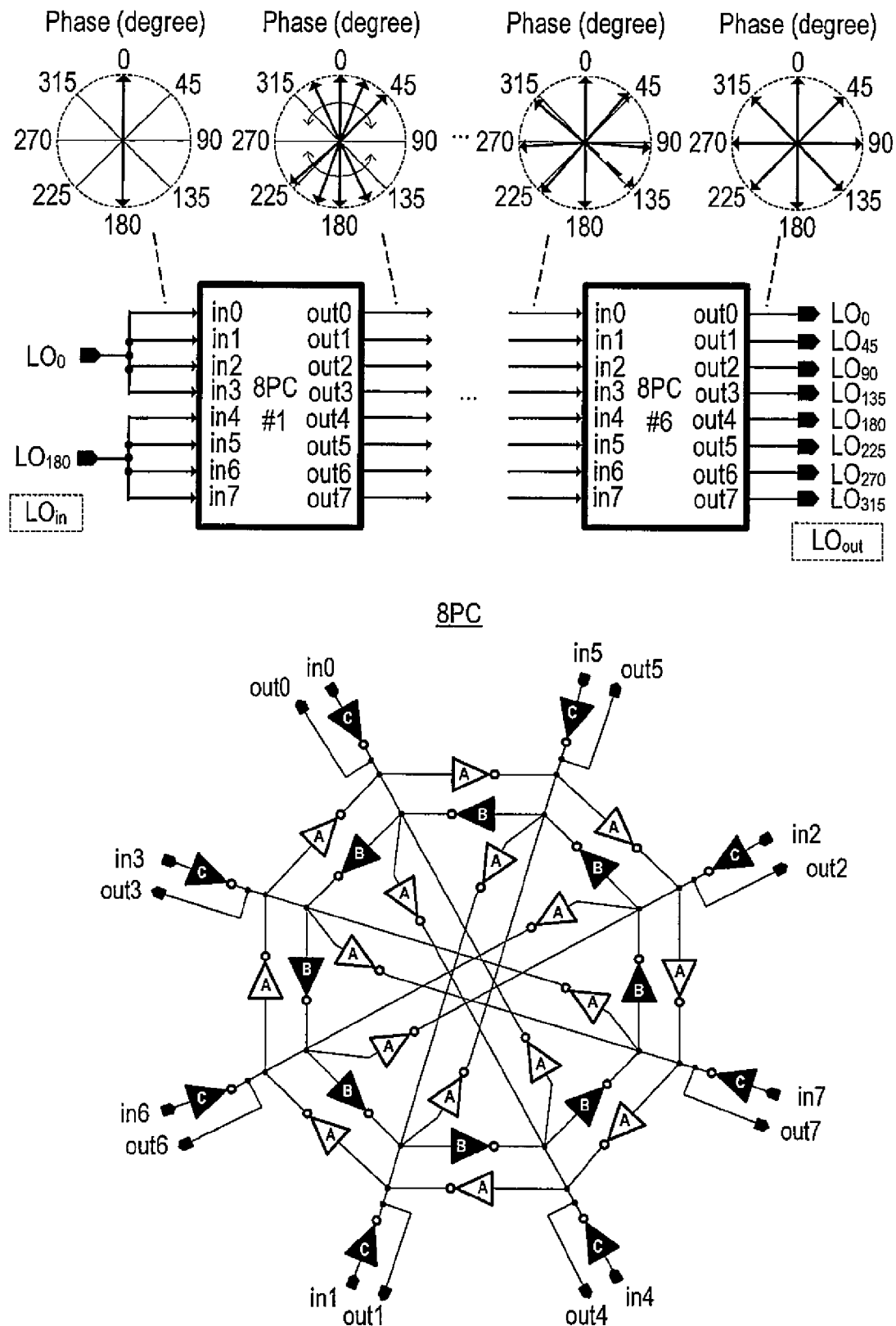

Poly-phase LOGs are commonly based on dividers, necessitating a high-frequency reference LO to be supported by the frequency synthesizer. As analyzed before, the required $3\sigma_\phi$ of the 8-phase (16-phase) LO is relaxed to 3.6° (1.6°). Thus, the recently proposed injection-locked 4-/8-phase phase correctors (4PC/8PC) [11], [12] can be employed to relax the frequency and tuning range of the reference LO. The 4PC [as shown in FIG. 10(a)] and 8PC [as shown in FIG. 10(b)] are inverter-only circuitry. They are expandable, by cascading more of themselves, to optimize the phase accuracy.

The inverters are classified into three sets and two types: set A is for interpolating the intermediated phases. Set B is for natural-frequency suppression which leads to a larger operating frequency range. Set C is for signal injection and direct cascade of itself. For the two types, L-type stands for a larger device size than the S-type. The size ratio between L- and S-type inverters determines the locking range and the phase accuracy. A larger size ratio implies better phase-correcting ability but a smaller locking range. The phase-correcting ability of 4PC (8PC) can also be enhanced by cascading more of themselves, at the expense of power. In post-layout simulations for a 1.0° phase error, a cascade of five 4PC with L/S=3 is minimum to progressively correct the phase error from 44°→14°→5.3°→1.9°→1.0° at 432 MHz with a total power of 5.1 mW. Similarly, a cascade of six 8PC with L/S=3.75 is minimum to correct the phase error from 52°→11°→4.4°→2.1°→1.2°→1.0° at 432 MHz with a total power of 6.0 mW.

Figure 11:
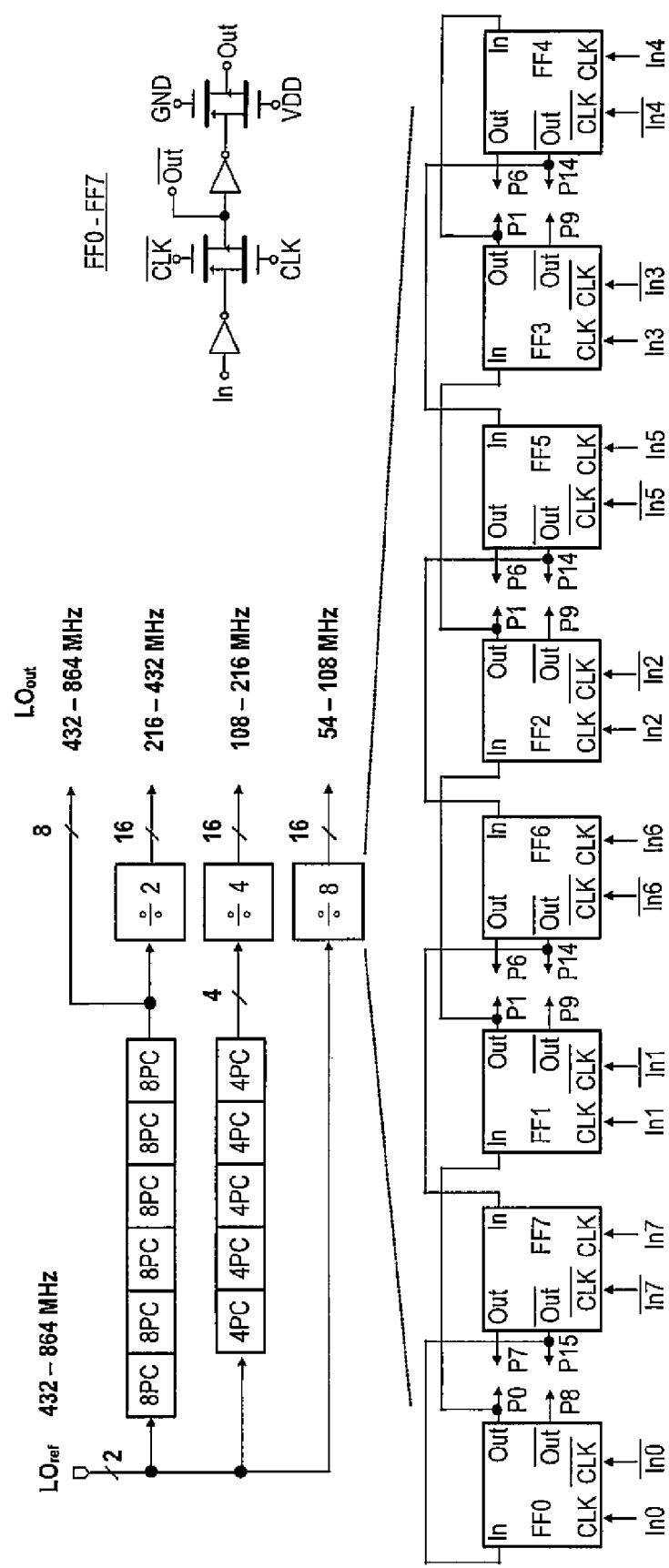
FIG. 11 illustrates one embodiment of proposed 8-/16-phase LOG and its circuit details.

The proposed 8-/16-phase LOG (FIG. 11) optimally combines different phase correctors and even-ratio-only frequency dividers to cover the entire TV band, allowing a low-frequency $LO_{ref}$ while offering appropriate 8- and 16-phase LOs for different frequency segments, i.e., 54 to 108 MHz, 108 to 216 MHz, 216 to 432 MHz and 432 to 864 MHz. The $LO_{ref}$ is minimized to alleviate the design of a wideband synthesizer [13] when optimizing the power, VCO pulling and tuning agility (a concern of CR for fast spectrum sensing). Moreover, the required division ratios for generating the 16-phase LO from 54-4.32 MHz are significantly reduced. All dividers in the layout are connected in a coiled manner [14] to equalize the delays between LO paths. The simulated frequency ranges of the four segments are 35 to 131 MHz, 70 to 263 MHz, 140 to 525 MHz and 280 to 1160 MHz. The overlaps give sufficient margins for PVT variations.

It will thus be seen that the invention provides design techniques and measurement results of a TV-band whitespace TX. The TX combines the wideband and robustness features of two-stage 6P-/14P-HRM, with the power and linearity benefits of passive-RC/-CLC filters, to manage the HRR fully on chip. Tested over 16 available 65 nm CMOS prototypes, the minimum HRR is 59.3 dB. The employed 8-/16-phase LOG is optimized via combining injection-locked 4PC/8PC and even-ratio frequency dividers. The LOG not only lowers the LO-path power (2.5 to 14.2 mW), but also the entailed reference LO frequency (432 to 864 MHz) that has been a common BW-bottleneck of most HRM-based architecture.

The improved performance of the present invention in comparison with the prior art is more apparent for its: (1) low required $LO_{ref}$; (2) common BB inputs (differential and I/Q); (3) high power efficiency over the TV band; and (4) high-and-robust HRR achieved fully on chip.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing the spirit or scope of the invention. Thus, the present invention is not intended to be limited to the embodiments shown herein but is to be accorded the widest scope consistent with the principles and novel features disclosed herein.

REFERENCES

[1] "IEEE 802 LAN/MAN Standards Committee 802.22 WG on WRANs (Wireless Regional Area Networks)". IEEE. Retrieved 2009 Jan. 18.

[2] H. Kim and K. Shin, "In-Band Spectrum Sensing in IEEE 802.22 WRANs for Incumbent Protection," IEEE Trans. on Mobile Computing, vol. 9, pp. 1766-1779, December 2010.

[3] B. Razavi, "Cognitive radio design challenges and techniques," IEEE J. Solid-State Circuits, vol. 45, pp. 1542-1553, August 2010.

[4] V. Fillatre, J. Tourret, S. Amiot, et al., "A SiP tuner with integrated LC tracking filter for both cable and terrestrial TV reception," in IEEE ISSCC Dig. Tech. Papers, pp. 208-597, February 2007.

[5] S. Subhan, E. Klumperink and B. Nauta, "Towards suppression of all harmonics in a polyphase multipath transmitter," in Proc. IEEE ISCAS, pp. 2185-2188, May 2011.

[6] J. Weldon, R. Narayanaswami, J. Rudell, L. Lin, M. Otsuka, S. Dedieu, L. Tee, K.-C. Tsai, C.-W. Lee and P. Gray, "A 1.75-GHz highly integrated narrow-band CMOS transmitter with harmonic-rejection mixers," IEEE J. Solid-State Circuits, vol. 36, no. 12, pp. 2003-2015, December 2001.

[7] J. Kim, S. Lee, S. Kim, J. Ha, Y. Eo and H. Shin, "A 54-862-MHz CMOS transceiver for TV-Band white-space device applications," IEEE Trans. Microw. Theory Tech., vol. 59, no. 4, pp. 966-977, April 2011.

[8] R. Shrestha, E. Mensink, E. Klumperink, G. Wienk and B. Nauta, "A multipath technique for canceling harmonics and sidebands in a wideband power upconverter," in ISSCC Dig. Tech. Papers, pp. 1800-1809, February 2006.

[9] Z. Ru, N. A. Moseley, E. Klumperink and B. Nauta, "Digitally enhanced software-defined radio receiver robust to out-of-band interference", IEEE J. Solid-State Circuits, vol. 44, no. 12, pp. 3359-3375, December 2009.

[10] A. Rafi, A. Piovaccari and P. Vancorenland, "A harmonic rejection mixer robust to RF device mismatches," in IEEE ISSCC Dig. Tech. Papers, pp. 66-68, February 2011.

[11] K.-F. Un, P.-I. Mak and R. Martins, "Analysis and design of open-loop multiphase local-oscillator generator for wireless applications," IEEE Trans. Circuits and Systems I: Regular Papers, vol. 57, no. 5, pp. 970-981, May 2010.

[12] P.-I. Mak and R. Martins, "A 0.46-mm2 4-dB NF unified receiver front-end for full-band mobile TV in 65-nm CMOS," IEEE J. of Solid-State Circuits, vol. 46, pp. 1970-1984, September 2011.

[13] M. Marutani, H. Anbutsu, M. Kondo, et al., "An 18 mW 90 to 770 MHz synthesizer with agile auto-tuning for digital TV-tuners," in ISSCC Dig. Tech. Papers, pp. 681-690, February 2006.

[14] W. Liu, W. Li, P. Ren, C. Lin, S. Zhang and Y. Wang, "A PVT tolerant 10 to 500 MHz all-digital phase-locked loop with coupled TDC and DCO," IEEE J. Solid-State Circuits, vol. 45, no. 2, pp. 314-321, February 2010.

What is claimed is:

1. A poly-phase local oscillator generator, comprising:
a plurality of phase correctors configured to relax frequency and tuning range of a reference local oscillator (LO); and
a plurality of frequency dividers coupled to the phase correctors, and configured to offer different frequency segments,
wherein the plurality of phase correctors are expandable by cascading more of the plurality of phase correctors for enhancing phase-correcting ability;
wherein each of the plurality of phase correctors is an inverter-only circuitry containing only inverters; and
wherein the inverters included in the inverter-only circuitry of the phase correctors are classified into three sets: a first set used for interpolating intermediated phases; a second set used for natural-frequency suppression which leads to a larger operating frequency range; and a third set used for signal injection and direct cascade of itself.

2. The poly-phase local oscillator generator of claim 1, wherein the plurality of phase correctors are direct-injection-locked phase correctors.

3. The poly-phase local oscillator generator of claim 1, wherein the plurality of phase correctors are 4-phase phase correctors and 8-phase phase correctors.

4. The poly-phase local oscillator generator of claim 1, wherein the plurality of frequency dividers are even-ratio-only frequency dividers.

5. A poly-phase local oscillator generator, comprising:
a plurality of phase correctors configured to relax frequency and tuning range of a reference local oscillator (LO); and
a plurality of frequency dividers coupled to the phase correctors, and configured to offer different frequency segments,
wherein the plurality of phase correctors are expandable by cascading more of the plurality of phase correctors for enhancing phase-correcting ability;
wherein each of the plurality of phase correctors is an inverter-only circuitry containing only inverters; and
wherein the inverters included in inverter-only circuitry of the phase correctors are classified into L-type and S-type inverters, wherein the L-type inverters have a larger device size than the S-type inverters, and wherein a size ratio between the L-type and the S-type inverters determines locking range and phase accuracy.

6. The poly-phase local oscillator generator of claim 5, wherein the plurality of phase correctors are direct-injection-locked phase correctors.

7. The poly-phase local oscillator generator of claim 5, wherein the plurality of phase correctors are 4-phase phase correctors and 8-phase phase correctors.

8. The poly-phase local oscillator generator of claim 5, wherein the plurality of frequency dividers are even-ratio-only frequency dividers.

* * * * *